US011264219B2

(12) United States Patent
Hwang et al.

(10) Patent No.: US 11,264,219 B2
(45) Date of Patent: Mar. 1, 2022

(54) RADICAL MONITORING APPARATUS AND PLASMA APPARATUS INCLUDING THE MONITORING APPARATUS

(71) Applicant: Samsung Electronics Co., Ltd., Suwon-si (KR)

(72) Inventors: Kwangtae Hwang, Seoul (KR); Jinyong Kim, Hwaseong-si (KR); Iksoo Kim, Yongin-si (KR); Geumbi Mun, Suwon-si (KR); Junwon Lee, Asan-si (KR); Jiwoon Im, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/814,040

(22) Filed: Mar. 10, 2020

(65) Prior Publication Data
US 2020/0335313 A1 Oct. 22, 2020

(30) Foreign Application Priority Data

Apr. 17, 2019 (KR) .................. 10-2019-0045133
Jul. 29, 2019 (KR) .................. 10-2019-0092009

(51) Int. Cl.
*H01J 37/32* (2006.01)

(52) U.S. Cl.
CPC .. *H01J 37/32935* (2013.01); *H01J 37/32082* (2013.01); *H01J 37/3299* (2013.01); *H01J 37/32357* (2013.01); *H01J 37/32743* (2013.01)

(58) Field of Classification Search
CPC ............... H01J 37/32; H01J 37/32082; H01J 37/32357; H01J 37/32743; H01J 37/32935; H01J 37/3299
See application file for complete search history.

(56) References Cited

U.S. PATENT DOCUMENTS

| 7,704,887 | B2 * | 4/2010 | Fu ..................... H01L 21/67069 438/710 |
| 8,545,669 | B2 | 10/2013 | Mahoney et al. |
| 9,155,184 | B2 | 10/2015 | Ng et al. |
| 10,128,160 | B2 | 11/2018 | Sakiyama et al. |
| 2007/0113868 | A1 * | 5/2007 | Fu ....................... H01J 37/3266 134/1.2 |
| 2010/0050938 | A1 * | 3/2010 | Tetsuka ............... H01J 37/3299 118/697 |
| 2010/0155600 | A1 | 6/2010 | Dzengeleski et al. |

(Continued)

FOREIGN PATENT DOCUMENTS

| JP | 5469991 | 4/2011 |
| JP | 2017091783 | 5/2017 |

(Continued)

*Primary Examiner* — Thai Pham
(74) *Attorney, Agent, or Firm* — Myers Bigel, P.A.

(57) ABSTRACT

Provided are a radical monitoring apparatus capable of monitoring electrical diagnosis of a radical produced by direct plasma or remote plasma and the amount of change of the produced radical, and a plasma apparatus including the radical monitoring apparatus. The plasma apparatus includes a process chamber in which a plasma process is performed, a dielectric film in the process chamber and surrounding sides of a plasma discharge space in the process chamber, and a sensor inside the dielectric film and configured to monitor plasma to thereby monitor a radical generated in the plasma.

19 Claims, 19 Drawing Sheets

(56) References Cited

U.S. PATENT DOCUMENTS

2017/0342556 A1\* 11/2017 Crook ................. C23C 16/4405
2018/0294146 A1\* 10/2018 Kumar .............. H01J 37/32091

FOREIGN PATENT DOCUMENTS

| KR | 1020070036844 | 4/2007 |
|----|---------------|--------|
| KR | 101787876 | 11/2007 |
| KR | 100976552 | 8/2010 |
| KR | 101012098 | 2/2011 |
| KR | 1020180010804 | 1/2018 |

\* cited by examiner

RADICAL MONITORING APPARATUS AND PLASMA APPARATUS INCLUDING THE MONITORING APPARATUS

CROSS-REFERENCE TO RELATED APPLICATIONS

This application claims the benefit of Korean Patent Application No. 10-2019-0045133, filed on Apr. 17, 2019, in the Korean Intellectual Property Office, and Korean Patent Application No. 10-2019-0092009, filed on Jul. 29, 2019, in the Korean Intellectual Property Office, the disclosures of which are incorporated by reference herein in their entireties.

BACKGROUND

The inventive concept relates to plasma monitoring, and more particularly, to a radical monitoring apparatus that monitors a radical produced by plasma and a plasma apparatus including the radical monitoring apparatus.

Generally, a series of processes, such as deposition, etching, cleaning, etc., may be performed to manufacture a semiconductor device. Such processes may be performed by a deposition apparatus, an etching apparatus, or a cleaning apparatus, which includes a process chamber. For improvement of selectivity, change of a feature of a membrane, minimization of damage to the membrane, etc., a plasma technology such as capacitive coupled plasma (CCP), inductive coupled plasma (ICP), or a combination of CCP and ICP has been employed. The plasma technology includes a direct plasma technology that directly produces plasma in a process chamber that is a wafer processing space and a remote plasma technology that produces plasma outside the process chamber and supplies the produced plasma to the process chamber.

SUMMARY

The inventive concept provides a radical monitoring apparatus capable of monitoring electrical diagnosis of a radical produced by direct plasma or remote plasma and the amount of change of the produced radical, and a plasma apparatus including the radical monitoring apparatus.

According to an aspect of the inventive concept, there is provided a plasma apparatus including a process chamber in which a plasma process is performed, a dielectric film in the process chamber and surrounding sides of a plasma discharge space in the process chamber, and a sensor inside the dielectric film and configured to monitor plasma to thereby monitor a radical generated in the plasma.

According to another aspect of the inventive concept, there is provided a plasma apparatus including a remote plasma source (RPS) that is configured to generate plasma, a process chamber in which a plasma process is performed for the plasma, a pipe extending between the RPS and the process chamber and configured to supply the plasma to the process chamber, a dielectric film that defines at least a portion of an inner wall of the pipe, and a sensor on or adjacent the dielectric film and configured to monitor the plasma to thereby monitor a radical generated in the plasma.

According to another aspect of the inventive concept, there is provided a radical monitoring apparatus including a dielectric film that surrounds plasma and a sensor on or adjacent the dielectric film and configured to monitor the plasma to thereby monitor a radical generated in the plasma.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1A:
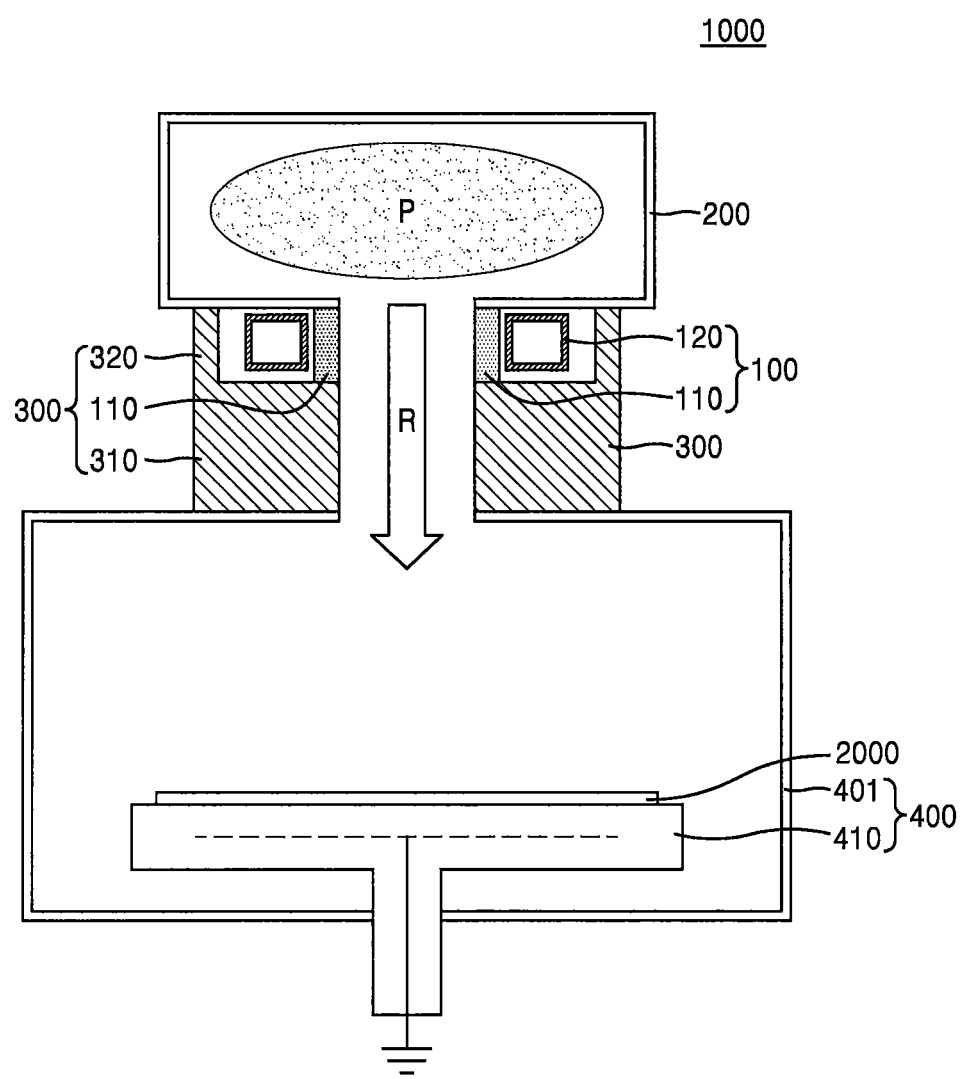
FIG. 1A is a cross-sectional view of a plasma apparatus including a radical monitoring apparatus according to an embodiment of the inventive concept.

Hereinafter, embodiments of the inventive concept will be described in detail with reference to the accompanying drawings. Like components in the drawings will be referred to as like reference numerals, and will not be repeatedly described.

Figure 1B:
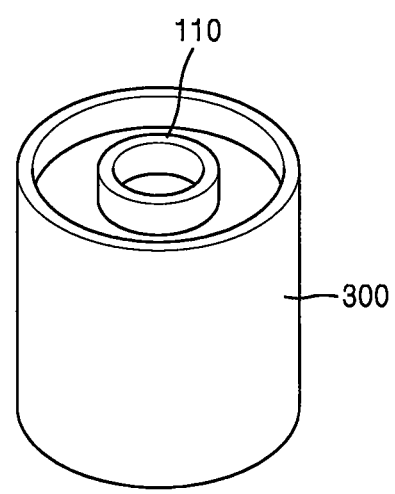
FIG. 1B is a perspective view of a pipe part of the plasma apparatus of FIG. 1A.

FIG. 1A is a cross-sectional view of a plasma apparatus including a radical monitoring apparatus according to an embodiment of the inventive concept, and FIG. 1B is a perspective view of a pipe part of the plasma apparatus of FIG. 1A.

Referring to FIGS. 1A and 1B, a plasma apparatus 1000 including a radical monitoring apparatus according to a current embodiment of the inventive concept (hereinafter, simply referred to as a 'plasma apparatus') may perform a plasma process using a remote plasma source (RPS) 200. For example, the plasma apparatus 1000 according to the current embodiment of the inventive concept may be a remote inductive coupled plasma (ICP) apparatus. However, the plasma apparatus 1000 according to the current embodiment of the inventive concept is not limited to the remote ICP apparatus. For example, the plasma apparatus 1000 according to the current embodiment of the inventive concept may include a direct capacitive coupled plasma (CCP) apparatus or a plasma apparatus including a combination of the remote ICP apparatus and the direct CCP apparatus. The direct CCP apparatus or the plasma apparatus including the combination will be described in more detail below with reference to FIGS. 9A through 12.

The plasma apparatus 1000 according to the current embodiment of the inventive concept may include a radical monitoring apparatus 100, the RPS 200, a pipe 300, and a process chamber 400. In the plasma apparatus 1000 according to the current embodiment of the inventive concept, a process gas and a control gas that are required by the RPS 200 are supplied and proper power is applied under a proper pressure and a proper temperature, thus producing plasma P in the RPS 200. As illustrated in FIG. 1A, one RPS 200 may be arranged outside the process chamber 400. However, the RPS 200 is not limited to one RPS. For example, a plurality of RPSs 200 may be provided. When the plurality of RPSs 200 are provided, different process gases and power may be supplied to each RPS 200, thus producing different plasma.

The plasma apparatus 1000 according to the current embodiment of the inventive concept may perform an etching process, a deposition process, a cleaning process, etc., by using the produced plasma P. For example, the plasma apparatus 1000 according to the current embodiment of the inventive concept may perform a deposition process such as an atomic layer deposition (ALD) process, by using a radical R produced in the plasma P. The ALD process using the radical R will be described in more detail below.

In addition, once the plasma P is produced in the RPS 200, components, such as an ion, an electron, an ultraviolet (UV) ray, etc., may be produced in addition to a radical R. At least one of the components, such as a radical R, an ion, an electron, an UV ray, etc., may be used for the etching process, the deposition process, the cleaning process, etc. Basically, the radical R may be electrically neutral and the ion may electrically have a polarity. Thus, when the plasma P is used for the etching process, the radical R may be used for isotropic etching of an etching target and the ion may be used for anisotropic etching the etching target. The radical R may also be used to disturb or inhibit deposition at a particular temperature. As such, the radical R used for inhibiting deposition is referred to as an inhibitor. In the plasma process using the radical R, the components, such as an ion, an electron, a UV ray, etc., may be removed. For example, when the plasma P is supplied to the process chamber through the pipe 300, the radical R without the components such as an ion, an electron, a UV ray, etc., may be supplied to the process chamber 400.

The process chamber 400 may be a chamber in which a process such as deposition, etching, cleaning, etc., using the plasma P is performed. For example, with respect to a wafer 2000 arranged on a stage 410 in the process chamber 400, deposition, etching, cleaning, etc., using the plasma P may be performed. The process chamber 400 may include a body or housing 401 and the stage 410. Although not shown, generally, the process chamber 400 may include a shower head (see, for example, 430 of FIG. 9A) arranged in an upper portion of the process chamber 400.

The body 401 may define a reaction space at an inside thereof and seal the reaction space from the outside. The body 401 may be formed of or generally formed of a metal material and maintain a ground state to block noise from the outside in the plasma process. The stage 410 may be arranged on a bottom surface of the inside of the body 401. The wafer 2000 that is subject to the plasma process may be arranged on a top surface of the stage 410. In addition, a heating line, a heater electrode, etc., may be arranged within the stage 410, such that the stage 410 may operate as a heater. The stage 410 is connected to ground, such that the ground or stage 410 may operate as an electrode in the CCP process. The shower head 430 will be described in relation to FIG. 9A.

The pipe 300 may be arranged between the RPS 200 and the process chamber 400. The pipe 300 may correspond to or define a passage that supplies the plasma P produced in the RPS 200 to the process chamber 400. The pipe 300 may be formed of a metal material, similar to the body 401 of the process chamber 400.

In the plasma apparatus 1000 according to the current embodiment of the inventive concept, the radical monitoring apparatus 100 may be arranged in the pipe 300. More specifically, the radical monitoring apparatus 100 may include a dielectric film 110 and a sensor 120. The dielectric film 110 may be formed of, e.g., a ceramic material, a polymer material, a fluoropolymer material such as polytetrafluoroethylene including TEFLON, etc. However, the dielectric film 110 is not limited to these materials. For example, the dielectric film 110 may be formed of various materials through which an electromagnetic field may pass, except for metal. However, as shown in FIG. 1A, the dielectric film 110 surrounds the plasma P, such that the dielectric film 110 may be formed of a material that is resistant to the plasma P.

As shown in FIG. 1A, the dielectric film 110 may form or define a part or portion of an inner wall of the pipe 300. The dielectric film 110 may be arranged adjacent to the RPS 200. For example, a part within 5 cm from a top end of the pipe 300 adjacent to the RPS 200 may be formed of the dielectric film 110. However, a position of the pipe 300 is not limited to the above numerical value. As shown in FIG. 1B, the dielectric film 110 may have a form of a circular or cylindrical pipe. However, the form of the dielectric film 110 is not limited to the circular pipe. For example, the dielectric film 110 may have a form of a polygonal pipe. According to an embodiment of the inventive concept, the dielectric film 110 may be formed in a part or portion of the circular pipe rather than the entire circular pipe. When the dielectric film 110 is formed as a part of the circular pipe, the other part of the circular pipe may be formed of a metal material.

As the dielectric film 110 may form or define a portion of the inner wall of the pipe 300, the pipe 300 may include a lower metal film or portion 310 in a lower portion thereof, the dielectric film 110 in an inner wall of an upper portion thereof, and an upper metal film or portion 320 on an outer wall thereof. A space may be formed or defined between the dielectric film 110 and the upper metal film 320. According to an embodiment of the inventive concept, when the dielectric film 110 is formed in a part of the inner wall of the pipe 300, a space may be formed in a part where the dielectric film 110 exists and the other part may be filled with metal, like the lower metal film 310.

The sensor 120 may be arranged in a space between the dielectric film 110 and the upper metal film 320, i.e., a space near the outside or outer surface of the dielectric film 110. However, according to an embodiment of the inventive concept, the sensor 120 may be arranged in the inside of the dielectric film 110 exposed to the plasma P. The sensor 120 may be one of various types of sensors capable of detecting the plasma P flowing to the inside of the dielectric film 110. Various types of sensors will be described in more detail below with reference to FIGS. 3A through 7.

The plasma apparatus 1000 according to the current embodiment of the inventive concept may include the radical monitoring apparatus 100 including the dielectric film 110 that forms the inner wall of the pipe 300 and is arranged adjacent to the RPS 200 and the sensor 120 arranged adjacent to the dielectric film 110. Thus, the plasma apparatus 1000 according to the current embodiment of the inventive concept may monitor the plasma P supplied to the pipe 300 through the radical monitoring apparatus 100 and monitor the radical R produced in the plasma P by monitoring the plasma P. As such, the plasma apparatus 1000 according to the current embodiment of the inventive concept may help prevent a defect in plasma processing and predict plasma processing by in-situ monitoring a change of the plasma P and a corresponding change of the radical R through the radical monitoring apparatus 100.

More specifically, in regard to monitoring of the radical R through the radical monitoring apparatus 100 according to the current embodiment of the inventive concept, there is no known existing technique for monitoring the radical R produced by direct CCP or remote ICP in a plasma apparatus. As a result, it is unavoidable to rely on post verification based on an output after plasma processing, e.g., physical properties of a wafer, a growth rate of a physical layer, etc., instead of real-time detection of the change of the radical R. As described above, an inhibitor as a sort of the radical R is electrically neutral, and thus may not be directly measured by an electrical monitoring tool. The number of radicals R produced in the plasma P is proportional to a density of the plasma P, such that a lot or a few of the radicals R may be inferred through monitoring of the plasma P. For remote ICP, there may be some charged particles near the RPS 200 in the pipe 300 connecting the RPS 200 with the process chamber 400. Thus, the radical monitoring apparatus 100 according to the current embodiment of the inventive concept may monitor the change of the plasma P by detecting the charged particles, and thus may monitor the change of the radical R.

Moreover, the radical R, especially, a radical functioning as an inhibitor, may play an important role in an ALD process using plasma. In ALD processing using plasma, a bottom up gap fill ALD process using an inhibitor in a pattern of a trench structure has the following sequence of operations: 1. perform the ALD process on a corresponding element for several cycles; 2. perform dosing of radical that is an inhibitor by using RPS; 3. perform a purge process; 4. inject a precursor for an ALD process; 5. perform a purge process; 6. supply oxygen ($O_2$) to a process chamber; 7. turn on plasma in the process chamber; 8. perform the purge process; 9. repeat operations #4 through #8 several times; and 10. repeat operations #2 through #9 several times.

Herein, the bottom up gap fill ALD process may mean an ALD process that fills a corresponding element from the bottom of a trench. When the trench that is subject to the ALI) process is structured to have a narrow bottom and a wide inlet, a groove may remain on a top surface of a portion corresponding to the trench after the trench is filled using a general ALD process. On the other hand, when the trench is structured to have a wide bottom and a narrow inlet, the inlet may be first blocked and thus a void may be generated after the trench is filled using the general ALD process. To solve such a problem, the bottom up gap fill ALD process using the inhibitor may be performed. For example, assuming that the trench is filled using the ALD process performed with Si, when a dose process is first performed by a fluorine (F) radical serving as an inhibitor, the F radical may be mainly injected near the inlet of the trench and may be hardly injected on the bottom of the trench. Meanwhile, on a layer to which the F radical is injected, Si may not be deposited well. Thus, the ALD process may be performed in a manner that the trench is filled by depositing Si sequentially from the bottom of the trench to which the F radical is not injected.

In the bottom up gap fill ALD process, the amount of injection for a radical that is an inhibitor is controlled by monitoring use of the radical monitoring apparatus 100 according to the current embodiment of the inventive concept, thereby improving consistency of the bottom up gap fill ALD process.

The plasma apparatus 1000 according to the current embodiment of the inventive concept may sense and control a dose of a radical in real time by monitoring a change of plasma and a corresponding change of a radical by using the radical monitoring apparatus 100. For example, in the plasma apparatus 1000 according to the current embodiment of the inventive concept, control over a dose of a radical may be performed by calculating a change of the radical or a dose of the radical through monitoring of a change of plasma using the radical monitoring apparatus 100 and adjusting a plasma process condition in such a way to increase or reduce plasma production when the dose of the radical deviates from a desired or required target. In the plasma apparatus 1000 according to the current embodiment of the inventive concept, control over a dose of a radical may be automatically performed by feeding back in real time a change of plasma and data regarding a corresponding change of a radical through the radical monitoring apparatus 100. That is, the plasma apparatus 1000 according to the current embodiment of the inventive concept may be implemented as a plasma auto process system that monitors a change of plasma and a corresponding change of a radical in real time and automatically reflects data obtained by monitoring a plasma process as a feedback.

Figure 2:
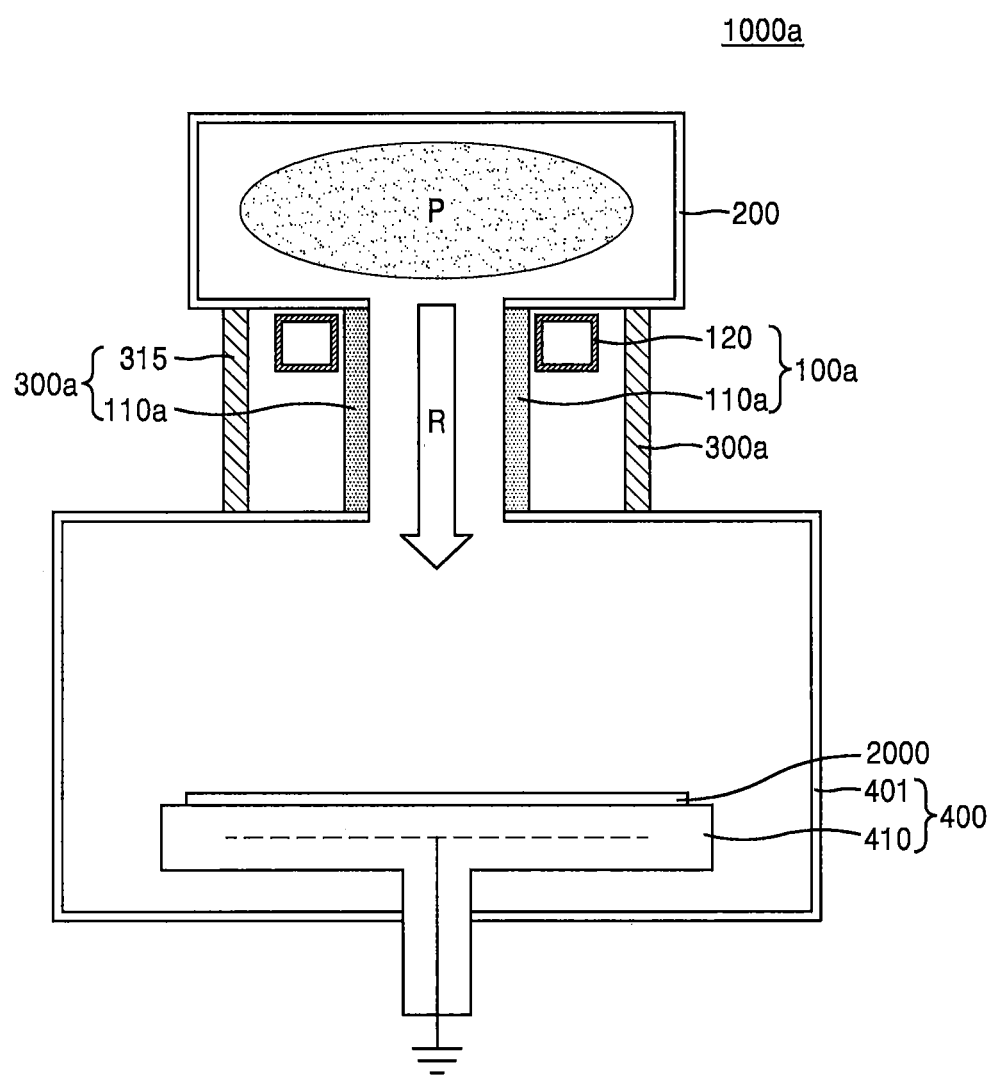
FIG. 2 is a cross-sectional view of a plasma apparatus including a radical monitoring apparatus according to an embodiment of the inventive concept.

FIG. 2 is a cross-sectional view of a plasma apparatus including a radical monitoring apparatus according to an embodiment of the inventive concept. A description already made with reference to FIGS. 1A and 1B may be simplified or omitted in the interest of brevity.

Referring to FIG. 2, a plasma apparatus 1000a according to the current embodiment of the inventive concept may be different from the plasma apparatus 1000 of FIG. 1A in a structure of a radical monitoring apparatus 100a. More specifically, in the plasma apparatus 1000a according to the current embodiment of the inventive concept, the radical monitoring apparatus 100a may be structured such that a dielectric film 110a may form or define the entire inner wall of a pipe 300a. In other words, as illustrated in FIG. 2, the entire inner wall of the pipe 300a from the RPS 200 to the process chamber 400 may be formed with the dielectric film 110a.

As the dielectric film 110a is formed in this way, the pipe 300a may include the dielectric film 110a as an inner wall and a metal film or portion 315 as an outer wall. In the pipe 300a, a space may be formed axially throughout between the dielectric film 110a and the metal film 315 from the RPS 200 to the process chamber 400. However, according to an embodiment of the inventive concept, a lower space is filled with a metal or dielectric material, and a space may be maintained in a part adjacent to the RPS 200.

Like in the radical monitoring apparatus 100 of FIG. 1A, the sensor 120 may be arranged adjacent to the dielectric film 110a. In addition, for electrical detection of plasma, regardless of a length of the space between the dielectric film 110a and the metal film 315, the sensor 120 may be arranged in a part of the dielectric film 110a adjacent to the RPS 200.

Figure 3A:
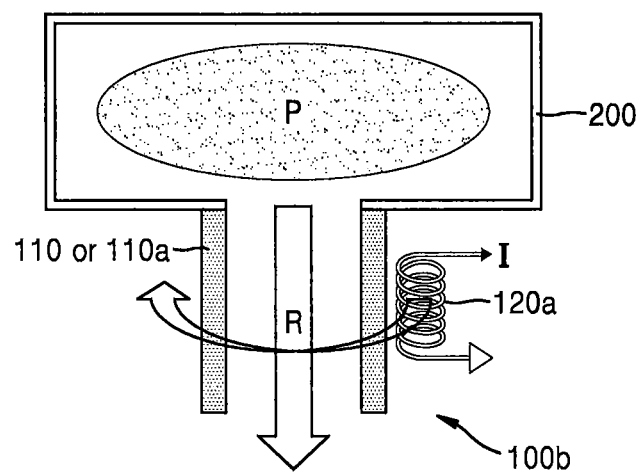
FIGS. 3A and 3B are respectively a cross-sectional view and a plan view showing a detailed structure of a radical monitoring apparatus according to an embodiment of the inventive concept.
Figure 3B:
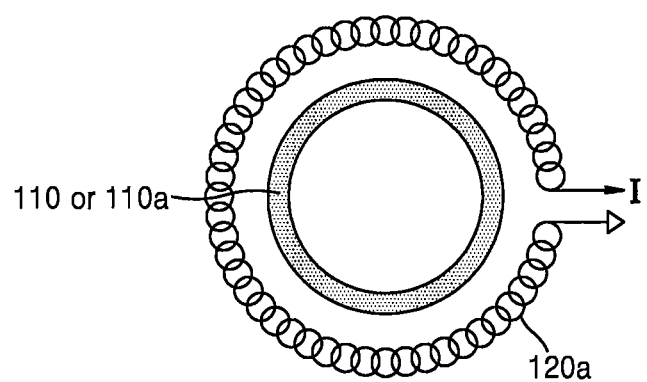

FIGS. 3A and 3B are a cross-sectional view and a plan view showing a detailed structure of a radical monitoring apparatus according to an embodiment of the inventive concept, in which FIG. 3A shows an RPS and a radical monitoring apparatus part and FIG. 3B shows a radical monitoring apparatus part.

Referring to FIGS. 3A and 3B, a radical monitoring apparatus 100b according to the current embodiment of the inventive concept may include a sensor 120a that detects current I based on an induced magnetic field with respect to a change of plasma flux. The radical monitoring apparatus 100b according to the current embodiment of the inventive concept may be included in the plasma apparatus 1000 or 1000a shown in FIG. 1A or 2. Thus, the dielectric film 110 or 110a may be formed short in an upper portion of the pipe 300 to be adjacent to the RPS 200 or may be formed throughout the pipe 300a (e.g., along the entire inner surface of the pipe 300a). The structure of the dielectric film 110 or 110a may be equally applied to other radical monitoring apparatuses 100c through 100f described below.

In the radical monitoring apparatus 100b according to the current embodiment of the inventive concept, the sensor 120a may include a Rogowski coil arranged in a form surrounding the dielectric film 110 or 110a. When the plasma P flows through the pipe 300 or 300a, an induced magnetic field indicated by a curved bold arrow is generated and current I flows through the Rogowski coil by the induced magnetic field. Thus, as a change of the current I is detected, a change of plasma, a corresponding change of a radical, or a dose to a process chamber may be monitored. Meanwhile, the sensor 120a may detect, for example, alternate or alternating current (AC). However, the current detected by the sensor 120a is not limited to AC.

Figure 4:
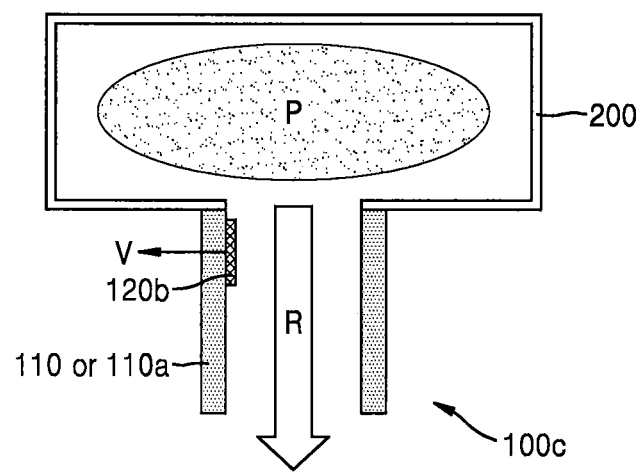
FIGS. 4 and 5 are cross-sectional views showing a detailed structure of a radical monitoring apparatus according to embodiments of the inventive concept.
Figure 5:
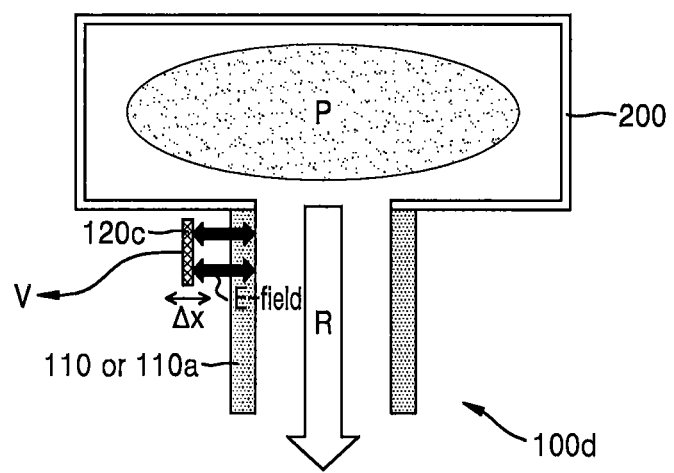

FIGS. 4 and 5 are cross-sectional views showing a detailed structure of a radical monitoring apparatus according to embodiments of the inventive concept, showing an RPS and a radical monitoring apparatus part.

Referring to FIG. 4, a radical monitoring apparatus 100c according to the current embodiment of the inventive concept may include a sensor 120b that directly detects a voltage V from the plasma P. In the radical monitoring apparatus 100c according to the current embodiment of the inventive concept, the sensor 120b may include an electrostatic probe arranged in such a way to pass through and be inserted into, e.g., the dielectric film 110 or 110a. A tip of the electrostatic probe may be arranged inside the dielectric film 110 or 110a directly exposed to the plasma P. The tip of the electrostatic probe may have a form of a circular or polygonal flat plate. However, according to an embodiment of the inventive concept, a tip of the electrostatic probe may have a form of a sharp tip corresponding to one point. The sensor 120b or the tip of the electrostatic probe may be on the inner surface of the dielectric film 110 or 110a.

The radical monitoring apparatus 100c according to the current embodiment of the inventive concept may monitor a change of the plasma P and a corresponding change of the radical R or a dose to a process chamber by directly detecting a change of voltage of the plasma P through the sensor 120b. In addition, the sensor 120b may detect, for example, direct current (DC). However, the voltage detected by the sensor 120b is not limited to a DC voltage. For example, according to an embodiment of the inventive concept, the sensor 120b may detect the AC voltage.

Referring to FIG. 5, a radical monitoring apparatus 100d according to the current embodiment of the inventive concept may include a sensor 120c that indirectly detects a DC voltage V from the plasma P. In the radical monitoring apparatus 100d according to the current embodiment of the inventive concept, the sensor 120c may be a sensor that is arranged outside the dielectric film 110 or 110a, for example, adjacent to the dielectric film 110 or 110a and detects the DC voltage V by detecting a change of an electric (E)-field while moving itself. In other words, generally, when a voltage of a measurement target is constant, the E-field becomes strong as the sensor 120c moves close to the measurement target and the E-field becomes weak as the sensor 120c moves away from the measurement target. Thus, as indicated by x in FIG. 5, a change of the E-field may be detected by changing a distance from the plasma P through movement of the sensor 120c, thereby indirectly detecting the voltage of the plasma P. The sensor 120c may be adjacent the outer surface of the dielectric film 110 or 110a.

The radical monitoring apparatus 100d according to the current embodiment of the inventive concept may monitor a change of the plasma P and a corresponding change of the radical R or a dose to a process chamber by indirectly detecting a change of voltage of the plasma P through the sensor 120c.

Figure 6A:
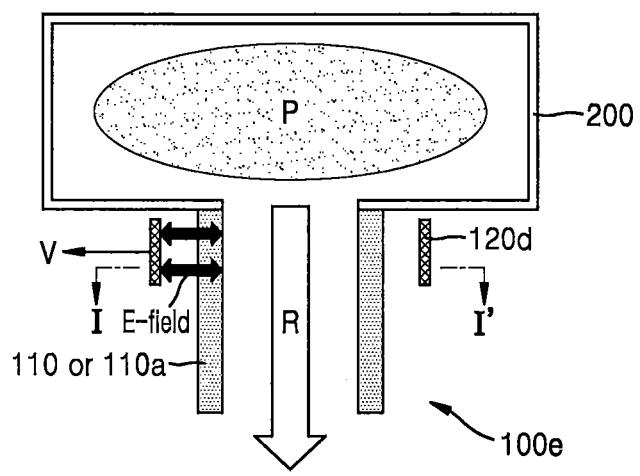
FIGS. 6A through 6C are respectively a cross-sectional view, a plan view, and a perspective view showing a detailed structure of a radical monitoring apparatus according to an embodiment of the inventive concept.
Figure 6B:
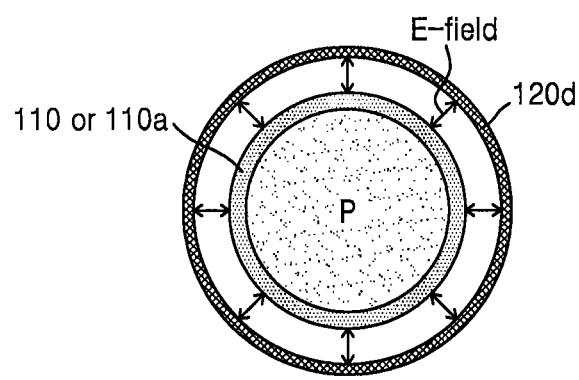
Figure 6C:
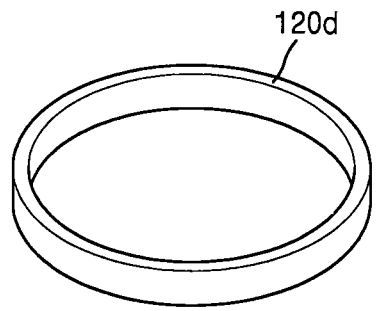

FIGS. 6A through 6C are respectively a cross-sectional view, a plan view, and a perspective view showing a detailed structure of a radical monitoring apparatus according to an embodiment of the inventive concept, in which FIG. 6A shows an RPS and a radical monitoring apparatus part, FIG. 6B shows a horizontal cross-section horizontally cut from a portion I-I' in FIG. 6A, and FIG. 6C shows a sensor part.

Referring to FIGS. 6A through 6C, a radical monitoring apparatus 100e according to the current embodiment of the inventive concept may include a sensor 120d that indirectly detects an AC voltage V from the plasma P. In the radical monitoring apparatus 100e according to the current embodiment of the inventive concept, the sensor 120d may be a sensor that is arranged to surround the dielectric film 110 or 110a and detects the AC voltage V. For example, as shown in FIGS. 6B and 6C, the sensor 120d may have a circular or annular ring form. When the sensor 120d has a circular ring form, the sensor 120d may detect the AC voltage V based on a change of the E-field.

The radical monitoring apparatus 100e according to the current embodiment of the inventive concept may monitor a change of the plasma P and a corresponding change of the radical R or a dose to a process chamber by detecting a change of the AC voltage V of the plasma P through the sensor 120d.

Figure 7:
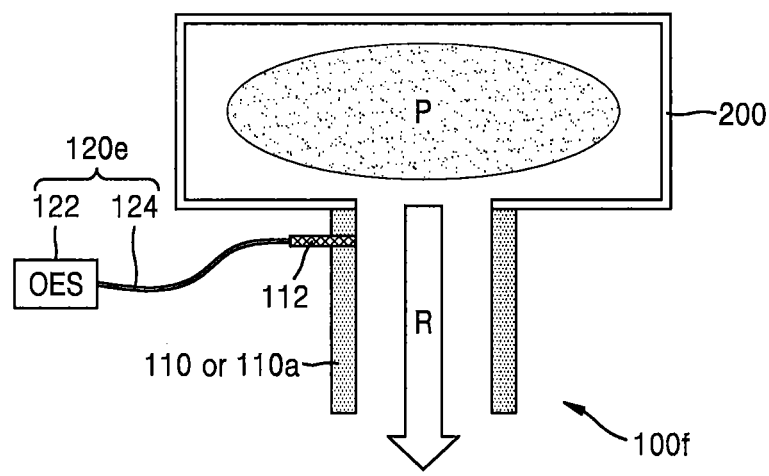
FIG. 7 is a cross-sectional view showing a detailed structure of a radical monitoring apparatus according to an embodiment of the inventive concept.

FIG. 7 is a cross-sectional view showing a detailed structure of a radical monitoring apparatus according to an embodiment of the inventive concept, showing an RPS and a radical monitoring apparatus part.

Referring to FIG. 7, a radical monitoring apparatus 100f according to the current embodiment of the inventive concept may include a sensor 120e that optically detects a state of the plasma P. In the radical monitoring apparatus 100f according to the current embodiment of the inventive concept, a quartz window 112 structured to pass through the dielectric film 110 or 110a may be formed in the dielectric film 110 or 110a. The quartz window 112 may extend through the dielectric film 110 or 110a. An optical emission spectroscopy (OES) sensor may be included as the sensor 120e. The OES sensor as the sensor 120e may include a spectroscope 122 and an optical fiber 124. The OES sensor as the sensor 120e may receive light of the plasma P supplied through the pipe 300 by using the quartz window 112 and the optical fiber 124 and analyze the received light by using the spectroscope 122, thus monitoring a change of the plasma P and a corresponding change of the radical R.

The radical monitoring apparatus 100f according to the current embodiment of the inventive concept may monitor a change of the plasma P and a corresponding change of the radical R or a dose to a process chamber, by optically detecting and analyzing the plasma P through the sensor 120e.

Figure 8:
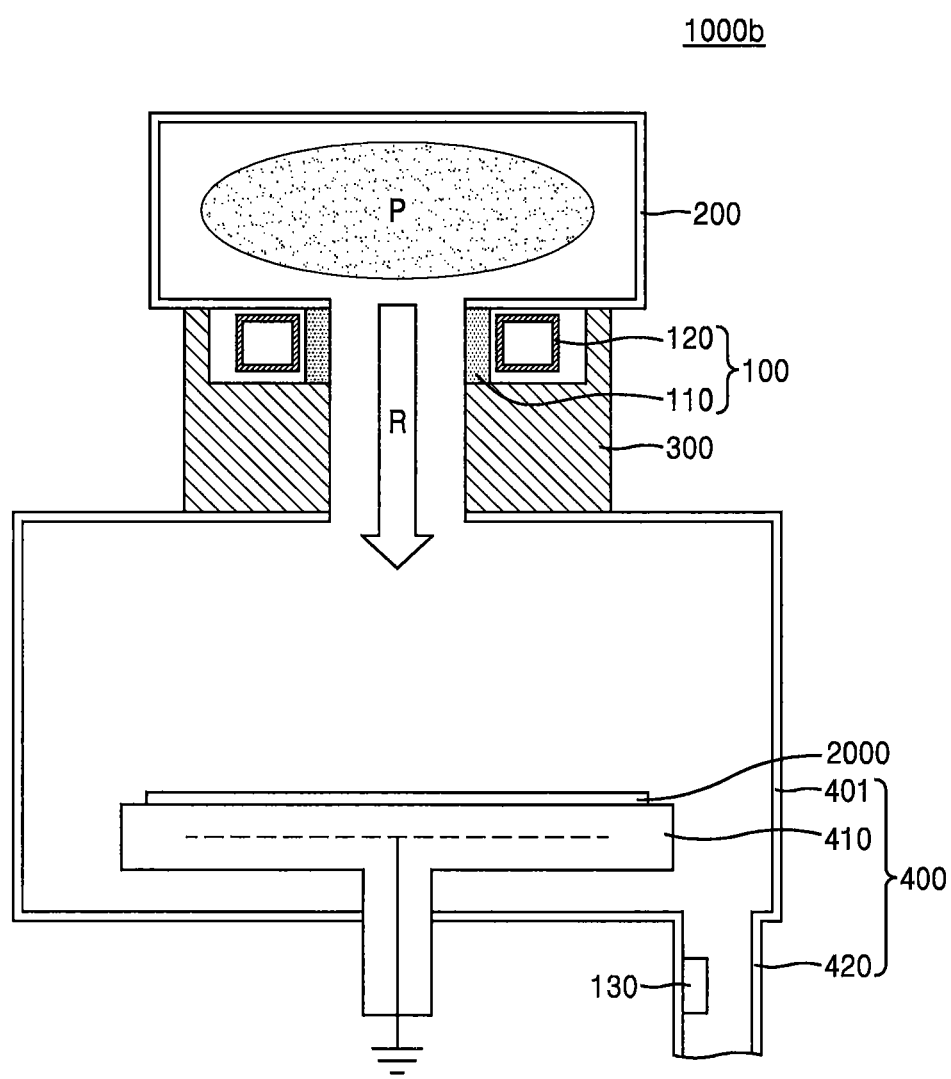
FIG. 8 is a cross-sectional view of a plasma apparatus including a radical monitoring apparatus according to an embodiment of the inventive concept.

FIG. 8 is a cross-sectional view of a plasma apparatus including a radical monitoring apparatus according to an embodiment of the inventive concept. A description already made with reference to FIGS. 1A and 1B may be simplified or omitted in the interest of brevity.

Referring to FIG. 8, a plasma apparatus 1000b according to the current embodiment of the inventive concept may be different from the plasma apparatus 1000 of FIG. 1A in that the plasma apparatus 1000b may further include an analyzer 130 in a discharge or discharging pipe 420 that discharges a byproduct after a plasma process. More specifically, in the plasma apparatus 1000b according to the current embodiment of the inventive concept, the analyzer 130 may be, for example, a residual gas analyzer (RGA) or an ICP mass spectroscope (ICP-MAS). By analyzing a component of the byproduct that is discharged through the discharging pipe 420 from the process chamber 400 by using the analyzer 130, a change of the plasma P and a corresponding change of the radical R in the plasma process may be determined or induced.

Thus, by analyzing the byproduct through the analyzer 130 arranged in the discharging pipe 420, the plasma apparatus 1000b according to the current embodiment of the inventive concept may monitor a change of the plasma P and a corresponding change of the radical R alone or together with the sensor 120 arranged in the pipe 300. In the plasma apparatus 1000b according to the current embodiment of the inventive concept, analysis of the byproduct through the analyzer 130 may be performed, for example, in the #3 purge process operation or the #8 purge process operation in the bottom up gap fill ALD process.

Figure 9A:
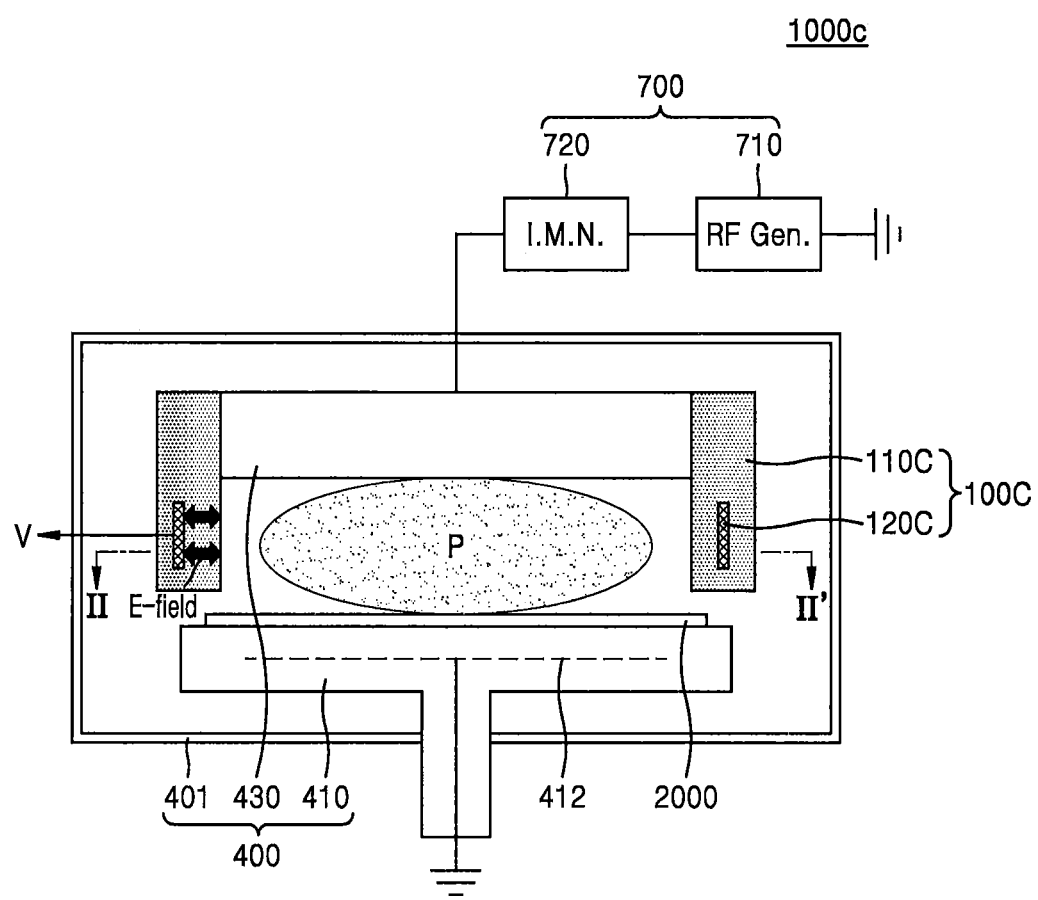
FIG. 9A is a cross-sectional view of a plasma apparatus including a radical monitoring apparatus according to an embodiment of the inventive concept.
Figure 9B:
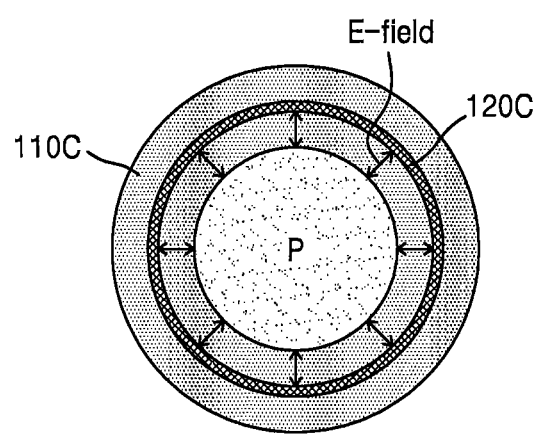
FIGS. 9B and 9C are respectively a plan view and a perspective view of a radical monitoring apparatus of the plasma apparatus of FIG. 9A.
Figure 9C:
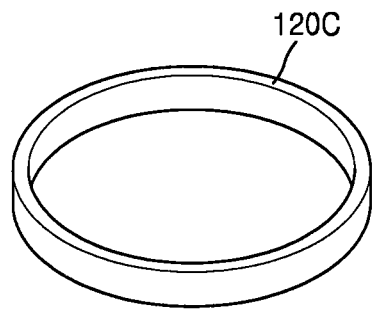

FIG. 9A is a cross-sectional view of a plasma apparatus including a radical monitoring apparatus according to an embodiment of the inventive concept. FIGS. 9B and 9C are respectively a plan view and a perspective view of a radical monitoring apparatus of a plasma apparatus of FIG. 9A. FIG. 9B shows a horizontal cross-section cut from a portion II-II' of a radical monitoring apparatus in the plasma apparatus of FIG. 9A, and FIG. 9C shows a sensor part.

Referring to FIGS. 9A through 9C, a plasma apparatus 1000c according to the current embodiment of the inventive concept may be different from the plasma apparatus 1000 of FIG. 1A, the plasma apparatus 1000a of FIG. 2, and the plasma apparatus 1000b of FIG. 8 in that the radical monitoring apparatus 100c is arranged in the process chamber 400. More specifically, the plasma apparatus 1000c according to the current embodiment of the inventive concept may be a direct CCP apparatus. For example, in the plasma apparatus 1000c according to the current embodiment of the inventive concept, the plasma P may be directly produced in the process chamber 400 through plasma discharging.

Thus, the plasma apparatus 1000c according to the current embodiment of the inventive concept may further include a radio frequency (RF) power device 700 connected to a shower head 430. The RF power device 700 may include an RF generator (RF Gen.) 710 and an impedance matching network (I.M.N.) 720. The RF generator 710 may generate RF power, and the impedance matching network 720 may stabilize plasma by adjusting impedance. As shown in FIG. 9A, the stage 410 may be connected to ground such that the stage 410 may function as a ground electrode. Depending on an embodiment of the inventive concept, the RF power device may be additionally connected to the stage 410.

In addition, the plasma apparatus 1000c according to the current embodiment of the inventive concept may be integrated with an ICP apparatus. Thus, in the plasma apparatus 1000c according to the current embodiment of the inventive concept, a coil antenna may be provided and the RF power device 700 may be connected to the coil antenna. The plasma apparatus 1000c according to the current embodiment of the inventive concept may be integrated with a remote ICP apparatus. For example, as in the plasma apparatus 1000e of FIG. 12, the RPS 200 that provides remote plasma to the process chamber 400 may be separated from the process chamber 400.

Generally, a plasma apparatus may have a structure in which a direct CCP apparatus and an ICP apparatus or a remote ICP apparatus are integrated. In the plasma apparatus structured as described above, a wafer 2000 that is subject to a plasma process may be etched or a physical layer may be deposited on the wafer 2000 by using the direct CCP apparatus and/or the ICP apparatus, and a plasma process target may be cleaned or dosing of a required element or radical may be performed by using the remote ICP apparatus. However, without being limited thereto, according to an embodiment of the inventive concept, etching or deposition may be performed on the plasma process target by using the remote ICP apparatus.

In the plasma apparatus 1000c according to the current embodiment of the inventive concept, the shower head 430 may be arranged in an upper portion of the inside of the process chamber 400. The shower head 430 may supply a process gas or a control gas required in production of the plasma P to the process chamber 400. The shower head 430 may be connected to the RF power device 700 to supply power for producing the plasma P. Depending on an embodiment of the inventive concept, the shower head 430 may be connected to the RPS 200 and supply plasma from the RPS 200 to the process chamber 400.

In the plasma apparatus 1000c according to the current embodiment of the inventive concept, the radical monitoring apparatus 100C may include a dielectric film 110C arranged inside the process chamber 400 and a sensor 120C arranged inside the dielectric film 110C. The dielectric film 110C may be structured to surround sides of the shower head 430 and a plasma discharging space, as shown in FIGS. 9A and 9B. Herein, the plasma discharging space may correspond to a space in which the plasma P is produced through discharging. For example, the dielectric film 110C may have a form of a circular or cylindrical pipe that surrounds the sides of the shower head 430 and the plasma discharging space above the stage 410. Depending on an embodiment of the inventive concept, the dielectric film 110C may be structured to surround the sides of the plasma discharging space under the shower head 430, except for the sides of the shower head 430. The dielectric film 110C may be coupled to, for example, the shower head 430, through a physical coupling device or member.

The dielectric film 110C may extend downward to contact a surface of an outer or upper portion of the stage 410. Whether the dielectric film 110C contacts or does not contact the surface of the stage 410 or a length by which the dielectric film 110C extends downward may vary depending on gas flow, plasma production and distribution, thickness distribution control of a physical layer deposited or etched by plasma, etc., in the plasma discharging space.

In the radical monitoring apparatus 100C according to the current embodiment of the inventive concept, the dielectric film 110C may be formed of a ceramic material, a polymer material, a fluoropolymer material such as polytetrafluoroethylene including TEFLON, etc. However, the material of the dielectric film 110C is not limited thereto. In the radical monitoring apparatus 100C according to the current embodiment of the inventive concept, a circular pipe that surrounds the shower head 430 and the plasma discharging space or only the plasma discharging space may be arranged above the stage 410, in which a part or portion of the circular pipe may be formed of the dielectric film 110C and the other part or portion of the circular pipe may be formed of a metal material.

In the radical monitoring apparatus 100C according to the current embodiment of the inventive concept, the sensor 120C may be arranged inside the dielectric film 110C. For example, as shown in FIGS. 9B and 9C, the sensor 120C may have a circular or annular ring form of a metal material. By using the sensor 120C structured as described above, a change of the E-field may be detected to detect a change of the voltage of the plasma P in the process chamber 400, thus monitoring a change of the plasma and a corresponding change of the radical in the process chamber 400. The sensor 120C may detect, for example, an AC voltage. However, the voltage detected by the sensor 120C is not limited to the AC voltage.

In addition, although not shown, the plasma apparatus 1000c according to the current embodiment of the inventive concept may further include an analyzer at or near the discharge or discharging pipe as shown at, for example, FIG. 8. By analyzing a component of the byproduct discharged through the discharging pipe by using the analyzer, a change of the plasma and a corresponding change of the radical in the plasma process may be determined or induced. Thus, the analyzer, together with the sensor 120C arranged in the process chamber 400, may contribute to monitoring of the change of the plasma P and the corresponding change of the radical.

Figure 10:
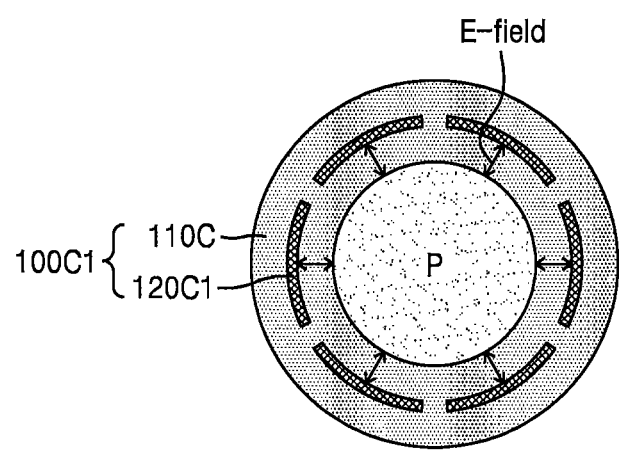
FIG. 10 is a plan view of a radical monitoring apparatus according to an embodiment of the inventive concept.

FIG. 10 is a plan view of a radical monitoring apparatus according to an embodiment of the inventive concept. A description already made with reference to FIGS. 9A through 9C may be simplified or omitted in the interest of brevity.

Referring to FIG. 10, a radical monitoring apparatus 100C1 according to the current embodiment of the inventive concept may be different from the radical monitoring apparatus 100c of the plasma apparatus 1000c of FIG. 9A in that sensors 120C1 have a circular ring form and are separated or spaced apart from each other. In other words, in the radical monitoring apparatus 100C1 according to the current embodiment of the inventive concept, multiple sensors 120C1 may be arranged to form the circular ring form and may be electrically separated from each other. Each of the multiple sensors 120C1 may detect a voltage of plasma corresponding to its position. Thus, the radical monitoring apparatus 100C1 according to the current embodiment of the inventive concept may monitor spatial distribution of the plasma P and spatial distribution of a corresponding radical in the process chamber 400. In this way, the radical monitoring apparatus 100C1 according to the current embodiment of the inventive concept may provide the concept of a spatial resolution of the plasma P and the radical in the process chamber 400 by monitoring spatial distribution of the plasma P and spatial distribution of the corresponding radical.

Figure 11A:
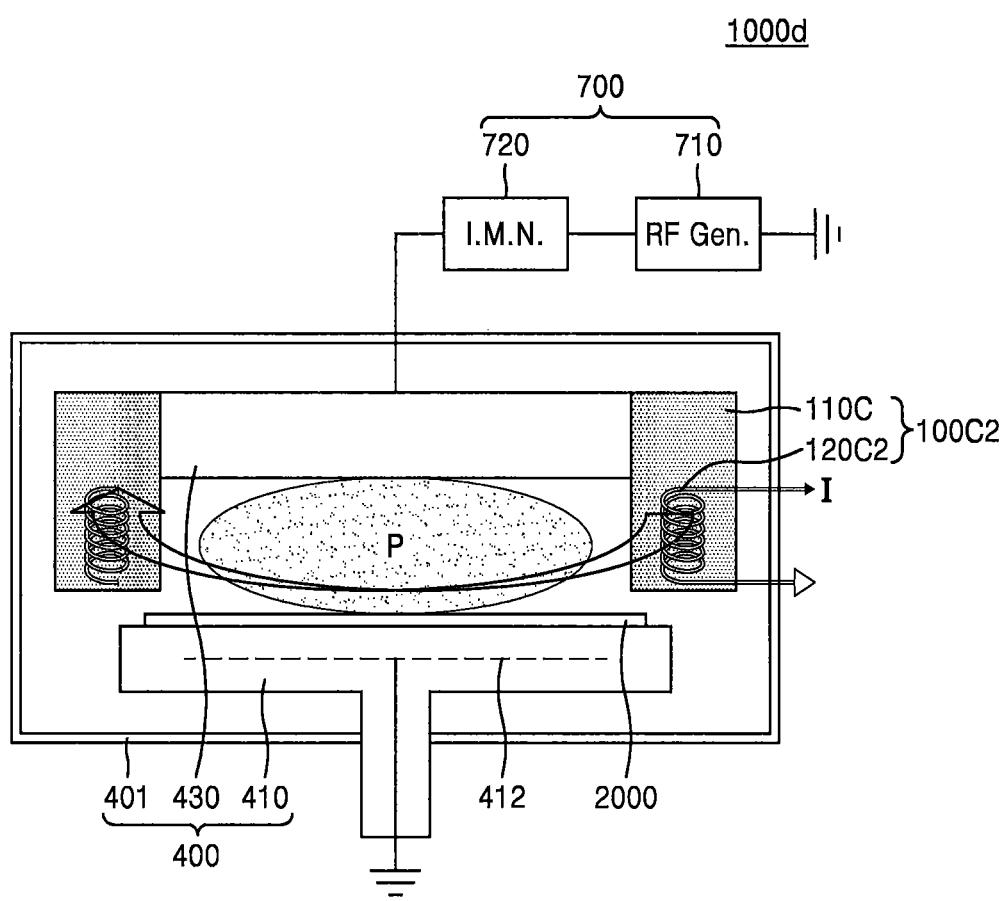
FIG. 11A is a cross-sectional view of a plasma apparatus including a radical monitoring apparatus according to an embodiment of the inventive concept.
Figure 11B:
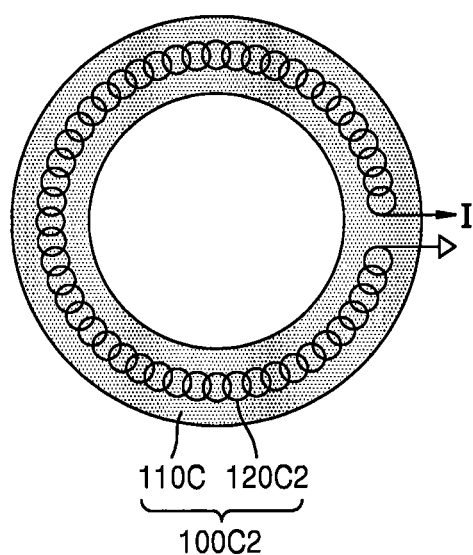
FIG. 11B is a plan view of a radical monitoring apparatus of a plasma apparatus of FIG. 11A.

FIG. 11A is a cross-sectional view of a plasma apparatus including a radical monitoring apparatus according to an embodiment of the inventive concept, and FIG. 11B is a plan view of a radical monitoring apparatus of a plasma apparatus of FIG. 11A.

Referring to FIGS. 11A and 11B, a plasma apparatus 1000d according to the current embodiment of the inventive concept may be different from the plasma apparatus 1000c of FIG. 9A in that a radical monitoring apparatus 100C2 includes a sensor 120C2 in a coil form. In the plasma apparatus 1000d according to the current embodiment of the inventive concept, the dielectric film 110C of the radical monitoring apparatus 100C2 may surround sides of the shower head 430 and the plasma discharging space. Depending on an embodiment of the inventive concept, the dielectric film 110C may surround the sides of the plasma discharging space under the shower head 430.

As shown in FIG. 11B, the sensor 120C2 may include a coil having a circular or annular ring form which is arranged inside the dielectric film 110C and surrounds the plasma discharging space. The sensor 120C2 may include, for example, a Rogowski coil. The sensor 120C2 may measure current based on an induced magnetic field (curved arrow in FIG. 11A) produced by RF current caused by plasma in the process chamber 400. As such, the radical monitoring apparatus 100C2 may monitor a change of plasma and a corresponding change of a radical in the process chamber 400 by measuring current through the sensor 120C2. Meanwhile, the sensor 120C2 may detect, for example, AC. However, the current detected by the sensor 120C2 is not limited to the AC.

Figure 12:
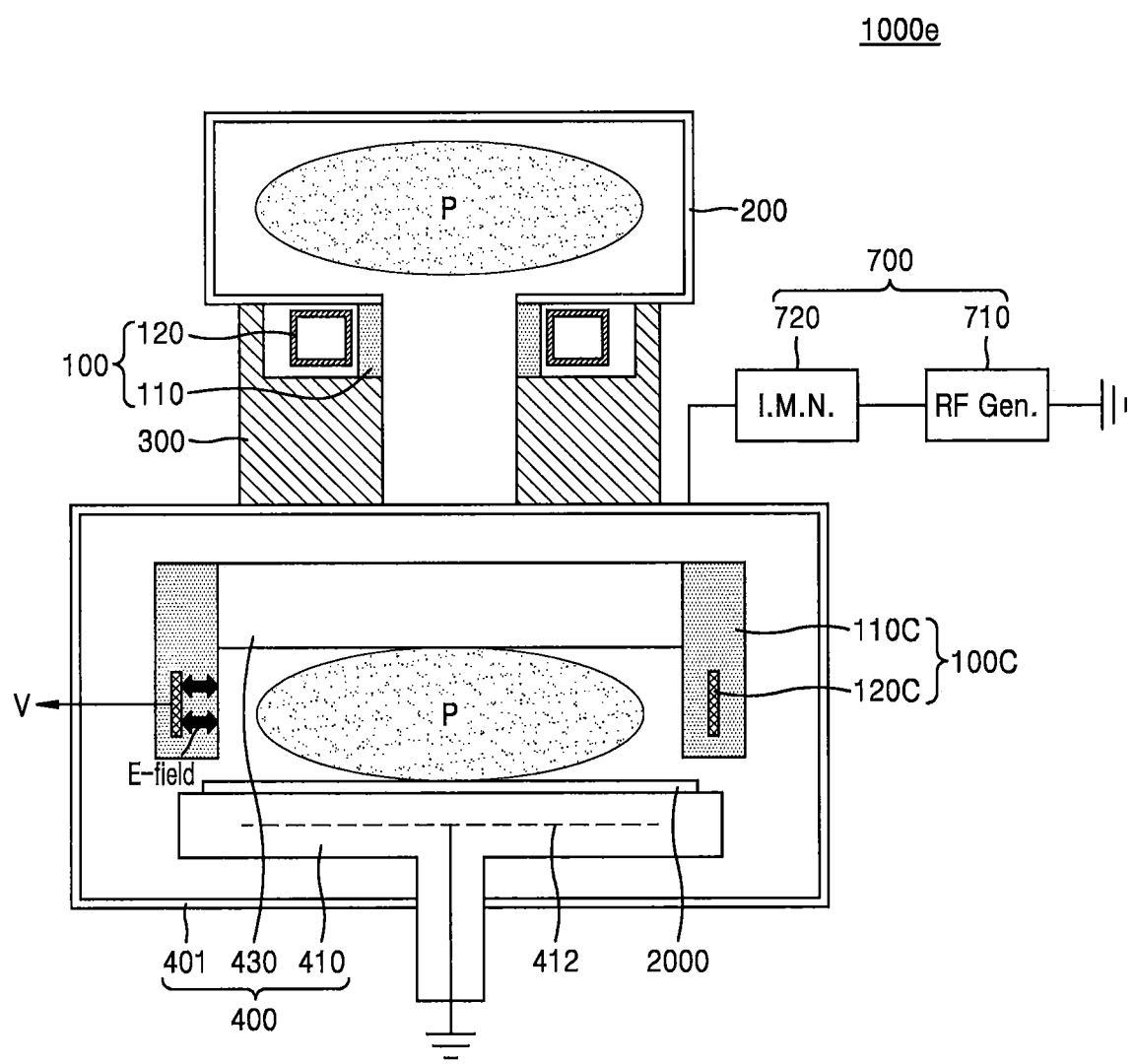
FIG. 12 is a cross-sectional view of a plasma apparatus including a radical monitoring apparatus according to an embodiment of the inventive concept.

FIG. 12 is a cross-sectional view of a plasma apparatus including a radical monitoring apparatus according to an embodiment of the inventive concept. A description already made with reference to FIGS. 1A, 1C, and 9A through 9C may be simplified or omitted in the interest of brevity.

Referring to FIG. 12, a plasma apparatus 1000e according to the current embodiment of the inventive concept may have a structure in which a direct CCP apparatus and a remote ICP apparatus are integrated. Moreover, the plasma apparatus 1000e according to the current embodiment of the inventive concept may include the two radical monitoring apparatuses 100 and 100C. For example, a first radical monitoring apparatus 100 may be arranged in a part of the pipe 300 connecting the RPS 200 with the process chamber 400, and a second radical monitoring apparatus 100C may be arranged in the process chamber 400. The first radical monitoring apparatus 100 may be the radical monitoring apparatus 100 described in relation to the plasma apparatus 1000 of FIG. 1A. However, without being limited thereto, the first radical monitoring apparatus 100 may correspond to the radical monitoring apparatuses 100a through 100f of FIGS. 2 through 7. In addition, the second radical monitoring apparatus 100C may be the radical monitoring apparatus 100C described in relation to the plasma apparatus 1000c of FIG. 9A. However, without being limited thereto, the second radical monitoring apparatus 100C may correspond to the radical monitoring apparatuses 100C1 and 100C2 of FIGS. 10 and 11A.

Meanwhile, although not shown, the plasma apparatus 1000e according to the current embodiment of the inventive concept may further include an analyzer at or near the discharge or discharging pipe as shown at, for example, FIG. 8. By analyzing a component of the byproduct discharged through the discharging pipe by using the analyzer, a change of the plasma and a corresponding change of the radical in the plasma process may be determined or induced. Thus, the analyzer, together with the sensor 120 arranged in the pipe 300 and the sensor 120C arranged in the process chamber 400, may contribute to monitoring of the change of the plasma P and the corresponding change of the radical.

While the inventive concept has been described with reference to the embodiments illustrated in the figures, it will be understood by those of ordinary skill in the art that various changes and other equivalent embodiments may be possible therefrom. Therefore, the true technical scope of the inventive concept should be defined by the appended claims.

What is claimed is:

1. A plasma apparatus comprising:
a process chamber in which a plasma process is performed;
a first radical monitoring apparatus including a dielectric film arranged inside the process chamber and a sensor arranged inside the dielectric film,
wherein the dielectric film in the process chamber surrounds sides of a plasma discharge space in the process chamber, and
the sensor inside the dielectric film is configured to monitor plasma to thereby monitor a radical generated in the plasma.

2. The plasma apparatus of claim 1, wherein
the dielectric film defines a portion of a cylindrical pipe or defines an entire cylindrical pipe, and
the cylindrical pipe surrounds sides of a shower head and the plasma discharge space in the process chamber.

3. The plasma apparatus of claim 1, wherein
the dielectric film contacts a top surface of a stage in the process chamber.

4. The plasma apparatus of claim 1, wherein
the sensor comprises a circular ring inside the dielectric film and is configured to detect a voltage corresponding to a change of an electric field of the plasma.

5. The plasma apparatus of claim 4, wherein
the circular ring comprises at least two spaced apart parts, and the sensor is configured to monitor spatial distribution of the plasma and spatial distribution of the radical in the process chamber.

6. The plasma apparatus of claim 1, wherein
the sensor comprises a coil inside the dielectric film and is configured to detect a current based on an induced magnetic field generated by a change of the plasma.

7. The plasma apparatus of claim 1, further comprising:
a remote plasma source (RPS) that is configured to generate remote plasma outside the process chamber;
a pipe extending between the process chamber and the RPS and that is configured to supply the remote plasma to the process chamber from the RPS; and
a second radical monitoring apparatus including a pipe dielectric film at an inner wall of the pipe and arranged adjacent the RPS and a pipe sensor arranged adjacent the pipe dielectric film,
wherein the pipe dielectric film defines at least a portion of the inner wall of the pipe, and
the pipe sensor on the pipe dielectric film is configured to monitor the remote plasma and the radical generated from the remote plasma.

8. The plasma apparatus of claim 7, wherein
the pipe dielectric film defines a portion of the inner wall of the pipe, which is adjacent the RPS, or the entire inner wall of the pipe.

9. The plasma apparatus of claim 7, wherein the pipe sensor is at least one of:
a first type outside the pipe dielectric film adjacent the RPS and is configured to detect a current based on an induced magnetic field corresponding to a change of the remote plasma supplied through the pipe;
a second type inside the pipe dielectric film adjacent the RPS and is configured to directly detect a direct current (DC) voltage of the remote plasma;
a third type outside the pipe dielectric film adjacent the RPS and is configured to indirectly detect a DC voltage of the remote plasma based on a change of an electric field corresponding to movement of the third type of sensor;
a fourth type comprising a circular ring surrounding the pipe dielectric film adjacent the RPS and that is configured to detect an alternating current (AC) voltage of the remote plasma; and
a fifth type comprising a window passing through the pipe dielectric film and is configured to optically detect the remote plasma through the window.

10. The plasma apparatus of claim 1, wherein
the plasma apparatus is configured to monitor the radical in real time and to feedback data regarding the radical to use the data in automation of the plasma process.

11. A plasma apparatus comprising:
a remote plasma source (RPS) that is configured to generate plasma;
a process chamber in which a plasma process is performed using the plasma;
a pipe extending between the RPS and the process chamber and is configured to supply the plasma to the process chamber; and
a radical monitoring apparatus including a dielectric film at an inner wall of the pipe and arranged adjacent the RPS and a sensor arranged adjacent the dielectric film,
wherein the dielectric film defines at least a portion of the inner wall of the pipe, and
the sensor is on or adjacent the dielectric film and configured to monitor the plasma to thereby monitor a radical generated in the plasma.

12. The plasma apparatus of claim 11, wherein
the dielectric film defines a portion of the inner wall of the pipe, which is adjacent the RPS, or the entire inner wall of the pipe.

13. The plasma apparatus of claim 11, wherein the sensor is at least one of:
a first type outside the dielectric film adjacent the RPS and configured to detect a current based on an induced magnetic field corresponding to a change of the plasma supplied through the pipe;
a second type inside the dielectric film adjacent the RPS and configured to directly detect a direct current (DC) voltage of the plasma;
a third type outside the dielectric film adjacent the RPS and configured to indirectly detect a DC voltage of the plasma based on a change of an electric field corresponding to movement of the third type of sensor;
a fourth type comprising a circular ring surrounding the dielectric film adjacent the RPS and configured to detect an alternating current (AC) voltage of the plasma; or
a fifth type comprising a window passing through the dielectric film and configured to optically detect the plasma through the window.

14. The plasma apparatus of claim 11, wherein the radical is an inhibitor that inhibits deposition of an element in a process of depositing the element.

15. The plasma apparatus of claim 11, further including an analyzer in a discharging pipe,
wherein the analyzer is configured to analyze a byproduct discharged from the process chamber and to analyze a component of the byproduct to thereby monitor the radical.

16. A radical monitoring apparatus comprising:
a dielectric film at an inner wall of a pipe and a sensor arranged adjacent the dielectric film,
wherein the dielectric film surrounds plasma,
wherein the sensor is on or adjacent the dielectric film and configured to monitor the plasma to thereby monitor a radical generated in the plasma, and
wherein the dielectric film defines at least a portion of the inner wall of the pipe, and the pipe is configured to supply the plasma from a remote plasma source (RPS) to a process chamber adjacent the RPS, or defines the entire inner wall of the pipe.

17. The radical monitoring apparatus of claim 16, wherein the sensor is at least one of:
a first type outside the dielectric film adjacent the RPS and configured to detect a current of the plasma based on an induced magnetic field corresponding to a change of the plasma supplied through the pipe;
a second type inside the dielectric film adjacent the RPS and configured to directly detect a direct current (DC) voltage of the plasma;
a third type outside the dielectric film adjacent the RPS and configured to indirectly detect a DC voltage of the plasma based on a change of an electric field corresponding to movement of the third type of sensor;
a fourth type comprising a circular ring surrounding the dielectric film adjacent the RPS and configured to detect an alternating current (AC) voltage of the plasma; or
a fifth type comprising a window passing through the dielectric film and configured to optically detect the plasma through the window.

18. The radical monitoring apparatus of claim 16, wherein the pipe is cylindrical and surrounds sides of a shower head and a plasma discharging space.

19. The radical monitoring apparatus of claim 18, wherein the sensor comprises a circular ring inside the dielectric film, the circular ring comprising at least two parts that are spaced apart from each other, and
the sensor is configured to monitor spatial distribution of the plasma and spatial distribution of the radical in the process chamber.

* * * * *